(12) United States Patent
Yao et al.

(10) Patent No.: US 10,437,094 B2
(45) Date of Patent: Oct. 8, 2019

(54) ARRAY SUBSTRATE AND MANUFACTURING METHOD THEREOF, AND DISPLAY DEVICE

(71) Applicant: BOE Technology Group Co., Ltd., Beijing (CN)

(72) Inventors: Qi Yao, Beijing (CN); Feng Zhang, Beijing (CN); Zhanfeng Cao, Beijing (CN); Shi Shu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 175 days.

(21) Appl. No.: 14/770,579

(22) PCT Filed: Nov. 7, 2014

(86) PCT No.: PCT/CN2014/090618
§ 371 (c)(1),
(2) Date: Aug. 26, 2015

(87) PCT Pub. No.: WO2016/011726
PCT Pub. Date: Jan. 28, 2016

(65) Prior Publication Data
US 2016/0370648 A1 Dec. 22, 2016

(30) Foreign Application Priority Data

Jul. 24, 2014 (CN) .......................... 2014 1 0355555

(51) Int. Cl.
*G02F 1/1335* (2006.01)
*G02F 1/1333* (2006.01)
(Continued)

(52) U.S. Cl.
CPC ...... *G02F 1/133514* (2013.01); *G02F 1/1335* (2013.01); *G02F 1/13439* (2013.01);
(Continued)

(58) Field of Classification Search
CPC ......... G02F 1/133514; G02F 1/134363; G02F 1/133516; G02F 1/133707;
(Continued)

(56) References Cited

U.S. PATENT DOCUMENTS

2004/0195573 A1 10/2004 Kim
2005/0140892 A1\* 6/2005 Kim .................. G02F 1/133707
349/139

(Continued)

FOREIGN PATENT DOCUMENTS

CN 1540426 A 10/2004
CN 101299106 A 11/2008
(Continued)

OTHER PUBLICATIONS

Jan. 20, 2017—(CN) Second Office Action Appn 201410355555.8 with English Tran.

(Continued)

*Primary Examiner* — Angela K Davison
(74) *Attorney, Agent, or Firm* — Banner & Witcoff, Ltd.

(57) ABSTRACT

An array substrate and a manufacturing method thereof, and a display device are provided. The array substrate includes: a plurality of pixel units arranged in an array, each of the pixel units including a first transparent electrode and a color filter unit opposite to each other. A first insulating layer is disposed between the first transparent electrode and the color filter unit, a protrusion is provided between adjacent first transparent electrodes, and a vertex of the protrusion is higher than an upper surface of the first transparent electrode.

8 Claims, 7 Drawing Sheets

(51) Int. Cl.
*G02F 1/1343* (2006.01)
*G02F 1/1362* (2006.01)
*H01L 27/12* (2006.01)

(52) U.S. Cl.
CPC .. *G02F 1/133345* (2013.01); *G02F 1/133512* (2013.01); *G02F 1/133516* (2013.01); *G02F 1/136209* (2013.01); *G02F 1/136286* (2013.01); *H01L 27/124* (2013.01); *H01L 27/1262* (2013.01); *G02F 1/1362* (2013.01); *G02F 2001/136222* (2013.01)

(58) Field of Classification Search
CPC ........ G02F 2001/134372; G02F 2001/136222; G02F 2001/133776; G02F 2201/52; G02F 1/133512; G02F 1/136209; G02F 2001/13622; G02F 2001/13629
USPC ......................................... 349/106, 108, 129
See application file for complete search history.

(56) References Cited

U.S. PATENT DOCUMENTS

| | | | | |
|---|---|---|---|---|
| 2007/0164286 | A1* | 7/2007 | Kim | G02F 1/136227 257/59 |
| 2010/0007811 | A1* | 1/2010 | Choi | G02F 1/136209 349/43 |
| 2011/0116029 | A1* | 5/2011 | Funahashi | G02F 1/136227 349/153 |
| 2011/0122351 | A1 | 5/2011 | Nagata | |
| 2012/0300161 | A1 | 11/2012 | Yang et al. | |
| 2013/0077008 | A1* | 3/2013 | Kim | G02F 1/136227 349/42 |

FOREIGN PATENT DOCUMENTS

| | | |
|---|---|---|
| CN | 101802659 A | 8/2010 |
| CN | 102236229 A | 11/2011 |
| CN | 103337497 A | 10/2013 |
| CN | 103645589 A | 3/2014 |
| CN | 103901659 A | 7/2014 |

OTHER PUBLICATIONS

Apr. 27, 2015—International Search Report and Written Opinion App PCT/CN20141090618 with English Tran.
May 25, 2016—(CN)—First Office Action Appn 201410355555.8 with English Tran.
Jul. 17, 2017—(CN) Third Office Action Appn 201410355555.8 with English Tran.
Aug. 15, 2018—(CN) Notification of Reexamination Appn 201410355555.8 with English Translation.

* cited by examiner

ARRAY SUBSTRATE AND MANUFACTURING METHOD THEREOF, AND DISPLAY DEVICE The application is a U.S. National Phase Entry of International Application No. PCT/CN2014/090618 filed on Nov. 7, 2014, designating the United States of America and claiming priority to Chinese Patent Application No. 201410355555.8 filed on Jul. 24, 2014. The present application claims priority to and the benefit of the above-identified applications and the above-identified applications are incorporated by reference herein in their entirety.

TECHNICAL FIELD

Embodiments of the present disclosure relate to an array substrate and a manufacturing method thereof, and a display device.

BACKGROUND

With development and progress of a Thin-Film Transistor Liquid Crystal Display (TFT-LCD Display) technology, a liquid crystal display device has replaced a cathode ray tube display device to become a mainstream display device in a daily display field.

Currently, in order to continuously improve quality of an image displayed by the liquid crystal display device, its resolution is constantly improved, seeking to provide a more clear and vivid display picture for a consumer. The resolution is defined as the number of pixel units per inch in the liquid crystal display device. The higher the resolution, the greater the number of the pixel units per inch, so that a size of the pixel unit in each liquid crystal display device is smaller and smaller, and further, a distance between pixel electrodes in two adjacent pixel units is smaller and smaller. As illustrated in FIG. 1, when a pixel electrode 10 is supplied with a certain operating voltage, interference occurs to an electric field between two adjacent pixel electrodes 10 (as illustrated by an arrow in the diagram), so that the quality of the display picture is affected.

For example, as illustrated in FIG. 2, when it is only required that liquid crystal molecules 12 corresponding to a certain pixel unit (marked as a) deflect while liquid crystal molecules 12 corresponding to the other pixel unit (marked as b) do not deflect, an interval between the pixel unit a and the pixel unit b is very small, so that interference occurs to the electric field between the two adjacent pixel electrodes 10, and as a result, liquid crystal molecules 12 between the pixel unit a and the pixel unit b, and the corresponding liquid crystal molecules 12 of the pixel unit b close to an edge of the pixel unit a deflect, so that phenomena such as color mixing and light leakage occur to the adjacent pixel units in the liquid crystal display device, which affects a display effect of the liquid crystal display device.

SUMMARY

According to an embodiment of the present disclosure, there is provided an array substrate, comprising: a plurality of pixel units arranged in an array, each of the pixel units including a first transparent electrode and a color filter unit stacked on a base substrate, wherein, a first insulating layer is disposed between the first transparent electrode and the color filter unit, a protrusion is provided between adjacent first transparent electrodes, and a vertex of the protrusion is higher than an upper surface of the first transparent electrode.

In one example, edges of adjacent color filter units are disposed overlapping each other, to form an overlapping region.

In one example, the protrusion at least includes a portion in the first insulating layer corresponding to the overlapping region.

In one example, the protrusion is the portion in the first insulating layer corresponding to the overlapping region.

In one example, the protrusion includes a first protrusion portion and a second protrusion portion located above the first protrusion portion; the first protrusion portion is constituted by the overlapping region of the adjacent color filter units, and the second protrusion portion is the portion in the first insulating layer corresponding to the overlapping region.

In one example, the array substrate further comprises: a plurality of gate lines and a plurality of data lines disposed on the base substrate; the protrusion corresponds to at least one of the gate lines, and/or, the protrusion corresponds to at least one of the data lines, and the gate lines and the data lines are disposed between the color filter units and the base substrate.

In one example, the protrusion is higher than the upper surface of the first transparent electrode by 1 μm-2 μm, a width of the protrusion is greater than a width of each of the gate lines, a difference between the width of the protrusion and the width of each of the gate lines is 3 μm-6 μm, the width of the protrusion is greater than a width of each of the data lines, and a difference between the width of the protrusion and the width of each of the data lines is 3 μm-6 μm.

In one example, the array substrate further comprises a black matrix, the black matrix being located between the adjacent pixel units, and corresponding to the protrusion.

In one example, each of the pixel units further includes: a second transparent electrode located above the first transparent electrode, and a second insulating layer disposed between the second transparent electrode and the first transparent electrode; the protrusion further includes a portion in the second insulating layer corresponding to the overlapping region, and the vertex of the protrusion is higher than an upper surface of the second transparent electrode.

In one example, the first transparent electrode is a pixel electrode, and the second transparent electrode is a common electrode; or, the first transparent electrode is a common electrode, and the second transparent electrode is a pixel electrode.

In one example, the protrusion includes: a first protrusion portion, a second protrusion portion located above the first protrusion portion, and a third protrusion located above the second protrusion portion; wherein, the first protrusion portion is constituted by the overlapping region of the adjacent color filter units; the second protrusion portion is the portion in the first insulating layer corresponding to the overlapping region; and the third protrusion is a portion in the second insulating layer corresponding to the overlapping region.

According to another embodiment of the present disclosure, there is provided a display device, comprising any one of the above-described array substrates.

According to still another embodiment of the present disclosure, there is provided a manufacturing method of an array substrate, comprising: forming a color filter layer, the color filter layer including a plurality of color filter units arranged in an array, adjacent color filter units having different colors, and edges of the adjacent color filter units being disposed overlapping each other, to form an overlapping region; forming a first insulating layer and a protrusion on the color filter layer, the protrusion at least including a portion in the first insulating layer corresponding to the overlapping region; forming a plurality of first transparent electrodes arranged in an array on the first insulating layer, each of the first transparent electrodes corresponding to one of the color filter units; the protrusion being located between adjacent first transparent electrodes, and a vertex of the protrusion being higher than an upper surface of the first transparent electrodes.

In one example, in forming the first insulating layer and the protrusion on the color filter layer, a manufacturing method of the protrusion includes: forming an insulating film layer on the color filter layer; forming the first insulating layer and the protrusion of the first insulating layer corresponding to the overlapping region by a patterning process.

In one example, in forming the first insulating layer and the protrusion on the color filter layer, a manufacturing method of the protrusion includes: arranging the edges of the adjacent color filter units overlapping each other, to form a first protrusion portion; naturally forming a second protrusion portion on the first protrusion portion upon the first insulating layer being formed.

In one example, the manufacturing method of the array substrate further comprises: forming a second insulating layer on the plurality of first transparent electrodes; forming a plurality of second transparent electrodes on the second insulating layer, wherein, the protrusion further includes a portion in the second insulating layer corresponding to the overlapping region, and the vertex of the protrusion is higher than an upper surface of the second transparent electrodes.

In the array substrate provided by the embodiment of the present disclosure, the protrusion is provided between the adjacent first transparent electrodes, and thus, when the first transparent electrode is supplied with a certain operating voltage, by using an isolation effect of the protrusion, a phenomenon of electric field interference between the adjacent first transparent electrodes will be significantly reduced, so that an effect of the interferential electric field on liquid crystal molecules between the adjacent first transparent electrodes can be reduced, which further alleviates phenomena such as color mixing and light leakage between the adjacent pixel units, and improves the display effect of the display device.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Embodiment One

Figure 1:
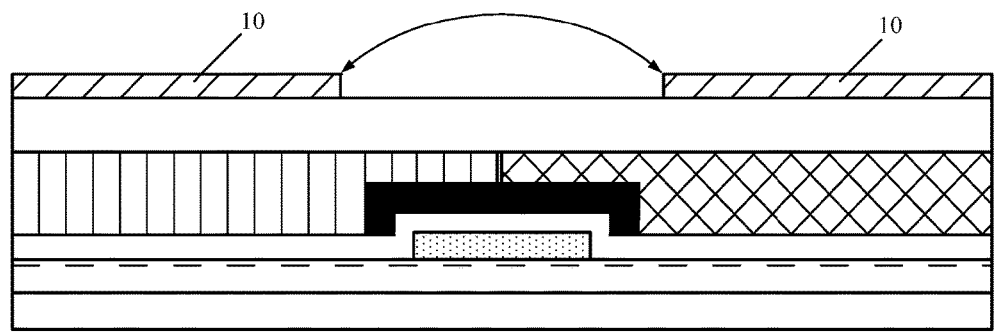
FIG. 1 is a structural schematic diagram of an array substrate in the prior art.
Figure 2:
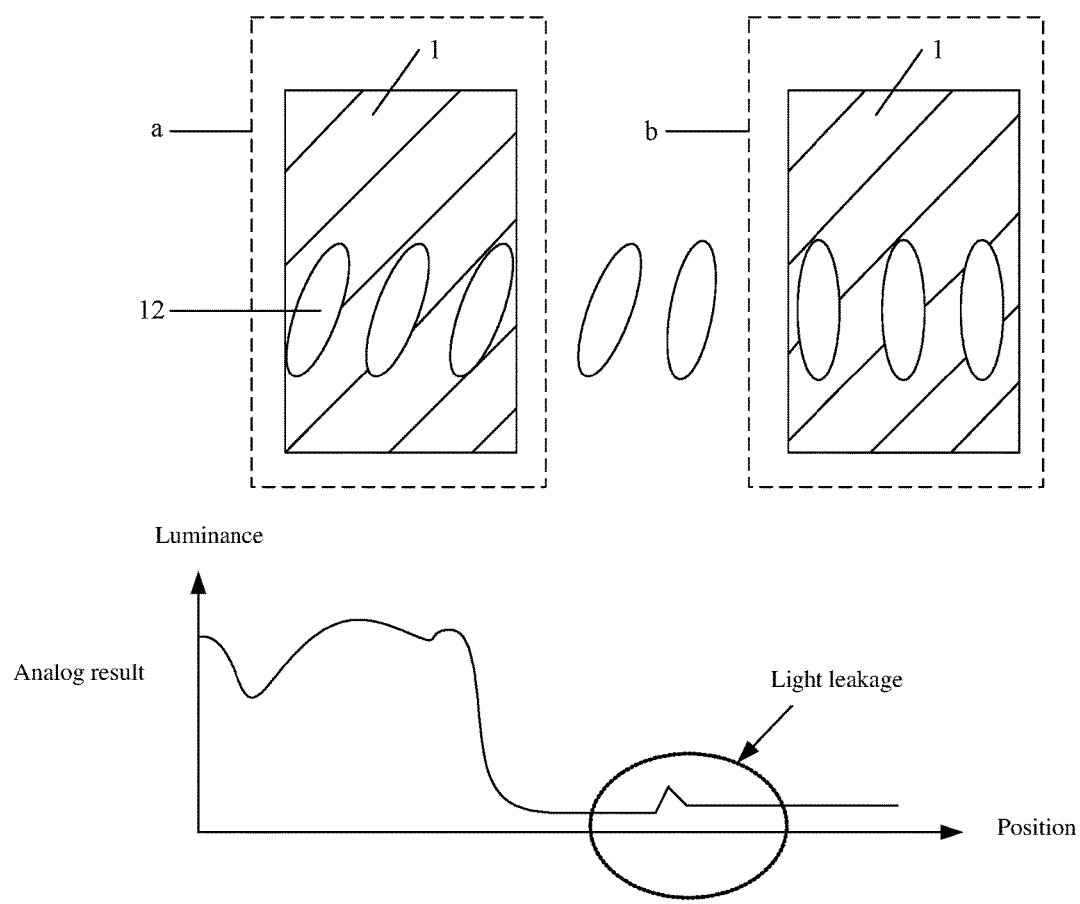
FIG. 2 is a schematic diagram of a test result of light leakage of the array substrate in the prior art.
Figure 3:
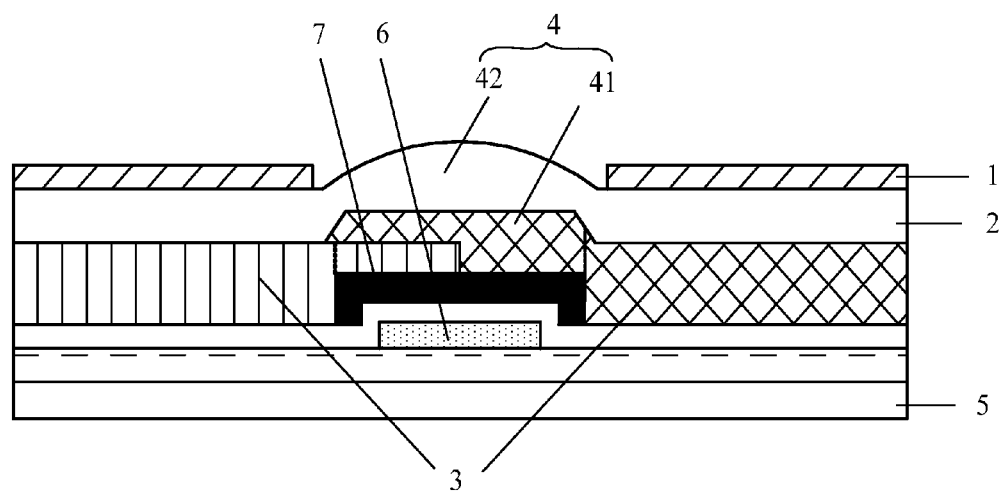
FIG. 3 is a structural schematic diagram I of an array substrate according to an embodiment of the present disclosure.

With reference to FIG. 3, the embodiment of the present disclosure provides an array substrate, comprising: a plurality of pixel units arranged in an array, each pixel unit including first transparent electrodes 1 and color filter units 3 disposed to be opposed to each other. As illustrated in FIG. 3, the first transparent electrodes 1 and the color filter units 3 are disposed in a stacking manner.

Edges of adjacent color filter units 3 are disposed overlapping each other, to form an overlapping region.

A first insulating layer 2 is provided between the first transparent electrodes 1 and the color filter units 3, and a protrusion 4 is provided between adjacent first transparent electrodes 1. The protrusion 4 at least includes a portion in the first insulating layer 2 corresponding to the overlapping region, and a vertex of the protrusion 4 is higher than an upper surface of the first transparent electrode 1.

Upon the above-described array substrate being applied to a display device, the protrusion 4 is provided between adjacent first transparent electrodes 1, the protrusion 4 can reduce a phenomenon of electric field interference between the adjacent first transparent electrodes 1, and can reduce an effect of the phenomenon of the electric field interference on the liquid crystal molecules 12 located between the adjacent first transparent electrodes 1, which thus can further alleviate the phenomena such as color mixing and light leakage between the adjacent pixel units, and improve the display effect of the display device.

Figure 4:
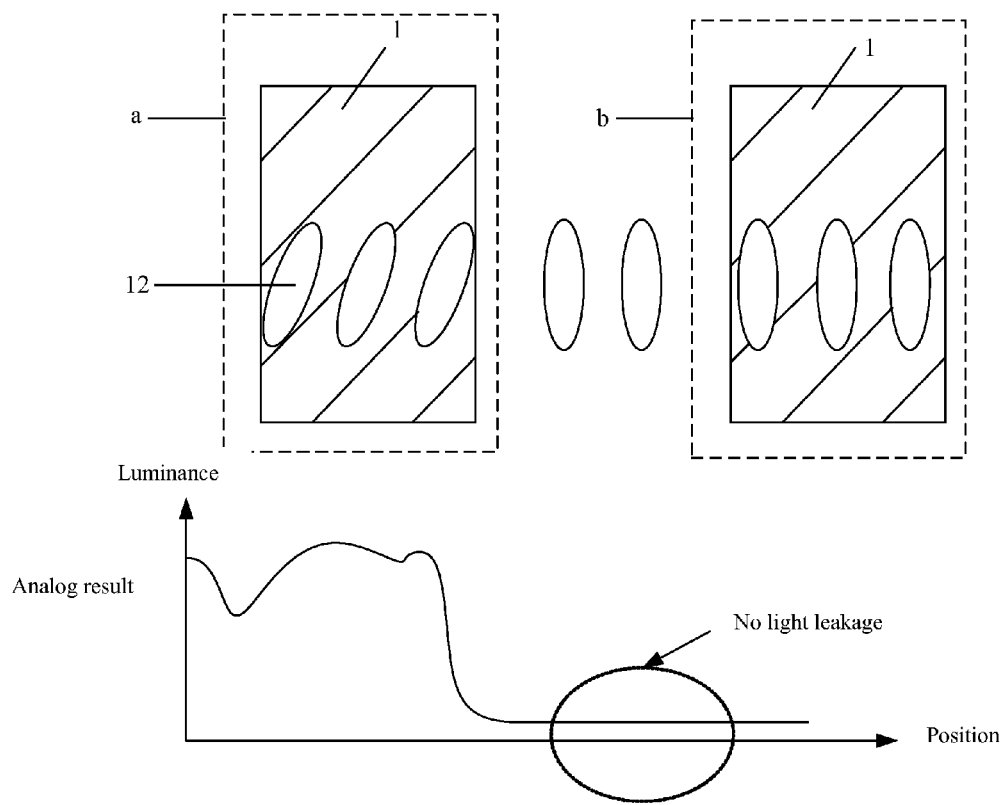
FIG. 4 is a schematic diagram of a test result of light leakage of the array substrate according to the embodiment of the present disclosure.

With reference to FIG. 4, the liquid crystal molecules 12 in a pixel unit a can deflect under an action of the electric field formed by the corresponding first transparent electrodes 1, the isolation effect of the protrusion 4 can alleviate the interference effect of the first transparent electrode 1 on the electric field of the other first transparent electrode 1 within a pixel unit b adjacent thereto, so that deflection of the liquid crystal molecules 12 between the adjacent first transparent electrodes 1 and the corresponding liquid crystal molecules 12 of the pixel unit b close to an edge of the pixel unit a can be alleviated, which can further alleviate the phenomena such as color mixing and light leakage between the adjacent two pixel units, and improve the display effect.

With further reference to FIG. 3, the protrusion 4 includes a first protrusion portion 41 and a second protrusion portion 42 located above the first protrusion portion 41. The first protrusion portion 41 is constituted by the overlapping region of the adjacent color filter units 3, and the second protrusion portion 42 is a portion in the first insulating layer 2 corresponding to the overlapping region. When the edges of the adjacent color filter units 3 are disposed overlapping each other, the first protrusion portion 41 as illustrated in FIG. 3 which is higher than a main body of the color filter unit 3 is formed in the overlapping region of the adjacent color filter units 3, and the adjacent color filter units 3 constituting the first protrusion portion 41 have different colors; because the first protrusion portion 41 is formed in the overlapping region of the adjacent color filter units 3, when the first insulating layer 2 is formed on the color filter unit 3, the second protrusion portion 42 will be naturally formed on the first insulating layer 2, and the second protrusion portion 42, as illustrated in FIG. 3, covers the first protrusion portion 41.

The above-described protrusion 4 includes the first protrusion portion 41 and the second protrusion portion 42. The first protrusion portion 41 is formed by providing the adjacent color filter units 3 overlapping each other, but is not limited thereto; for example, when the first protrusion portion 41 which is higher than the main body of the color filter unit 3 is not formed in the overlapping region of the adjacent color filter units 3, a support pad may be provided in the overlapping region of the adjacent color filter units 3, the second protrusion portion 42 will also be naturally formed on the support pad when the first insulating layer 2 is formed, and in this case, the protrusion portion 4 includes the support pad and the second protrusion portion 42 covering the support pad. Of course, the second protrusion 42 is not limited to be formed in the first insulating layer 2, and it may also be separately made from an additional material. As another example, when the first protrusion portion 41 which is higher than the main body of the color filter unit 3 is not formed in the overlapping region of the adjacent color filter units 3, an insulating film layer is formed on the color filter unit 3, and the first insulating layer 2 and the protrusion 4 are formed on the insulating film layer by one patterning process, and in this case, the protrusion 4 is a portion in the first insulating layer 2 corresponding to the above-described overlapping region.

Figure 5:
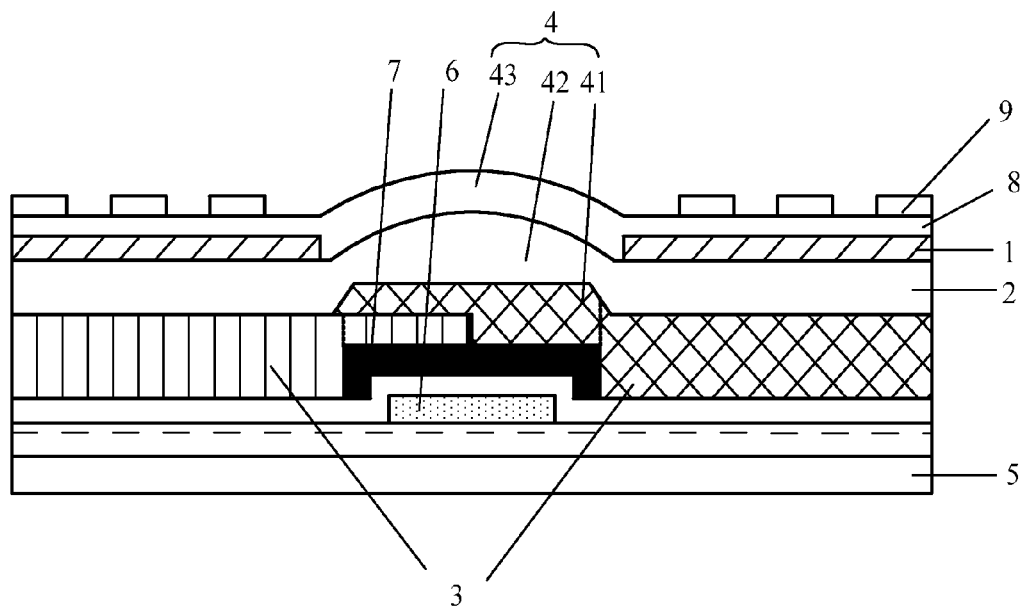
FIG. 5 is a structural schematic diagram II of the array substrate according to the embodiment of the present disclosure.

With reference to FIG. 5, in one implementation mode, each pixel unit further includes: a second transparent electrode 9 located above the first transparent electrode 1, and a second insulating layer 8 disposed between the second transparent electrode 9 and the first transparent electrode 1; the protrusion 4 further includes a portion in the second insulating layer 8 corresponding to the overlapping region, the vertex of the protrusion 4 is higher than an upper surface of the second transparent electrode 9; wherein, the first transparent electrode 1 is a pixel electrode, and the second transparent electrode 9 is a common electrode; or, the first transparent electrode 1 is a common electrode, and the second transparent electrode 9 is a pixel electrode. It should be noted that, in the above-described array substrate, the first insulating layer 2 and the second insulating layer 8 may be made of insulating materials such as silicon oxide, silicon nitride, hafnium oxide or a resin; the pixel electrode may be optionally a strip electrode or a plate electrode, and the common electrode may be optionally a strip electrode or a plate electrode.

In order to achieve the isolation effect, the vertex of the protrusion 4 is required to be higher than the upper surface of the second transparent electrode 9. In order to achieve a better effect of isolating the electric field interference, a height difference between the vertex of the protrusion 4 and the upper surface of the second transparent electrode 9 is 1 μm-2 μm. In this case, the protrusion 4 includes: a first protrusion portion 41, a second protrusion portion 42 located above the first protrusion portion 41, and a third protrusion 43 located above the second protrusion portion 42. The first protrusion portion 41 is constituted by the overlapping region of the adjacent color filter units 3; the second protrusion portion 42 is the portion in the first insulating layer 2 corresponding to the overlapping region, and covers the first protrusion portion 41; and the third protrusion 43 is a portion in the second insulating layer 8 corresponding to the overlapping region, and covers the second protrusion portion 42. A specific forming procedure is substantially same as a forming procedure of the protrusion 4 in FIG. 3, which will not be repeated.

With further reference to FIG. 3 and FIG. 5, the above-described array substrate further comprises: a base substrate 5, a plurality of gate lines (not illustrated) and a plurality of data lines 6 (not illustrated) disposed on the base substrate 5; the protrusion 4 corresponds to at least one gate line, and/or, the protrusion 4 corresponds to at least one data line 6. Since the gate line and the data line 6 can define a pixel unit, the first transparent electrode 1 is located in the pixel unit and basically occupies the pixel unit; and meanwhile, the protrusion 4 is located between the adjacent first transparent electrodes 1, and it can be known that the protrusion 4 is disposed corresponding to the gate line and/or the data line 6. For example, the first transparent electrode 1 and the color filter unit 3 are stacked on the base substrate 5.

In the above-described array substrate, generally the respective pixel units are of a rectangular structure, including long sides and short sides; since potentials of the first transparent electrode 1 of each pixel unit are not equal when the display device is in operation, the pixel units are not in contact with each other; and when the pixel units are arranged on the array substrate, for the pixel units, the long side is adjacent to the long side, the short side is adjacent to the short side, and the long side is perpendicular to the short side. Since the first transparent electrode 1 usually occupies the pixel unit completely, that is, for the adjacent first transparent electrodes 1, the long side is adjacent to the long side, the short side is adjacent to the short side, there is an interval between the adjacent first transparent electrodes 1, and the protrusion 4 may be located at the interval between the adjacent first transparent electrodes 1. Hereinafter, a structure of the array substrate provided by the embodiment of the present disclosure will be further explained by describing an arrangement mode of the protrusion 4.

Figure 6:
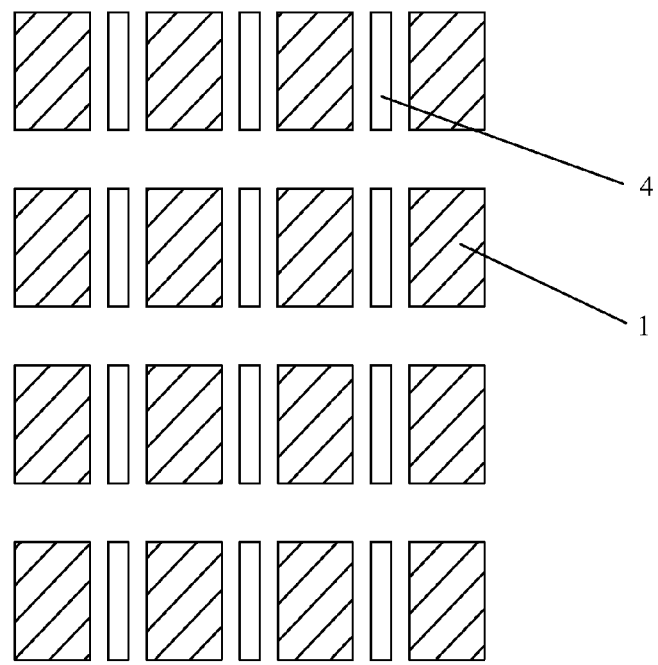
FIG. 6 is a plan schematic diagram I of the array substrate according to the embodiment of the present disclosure.
Figure 7:
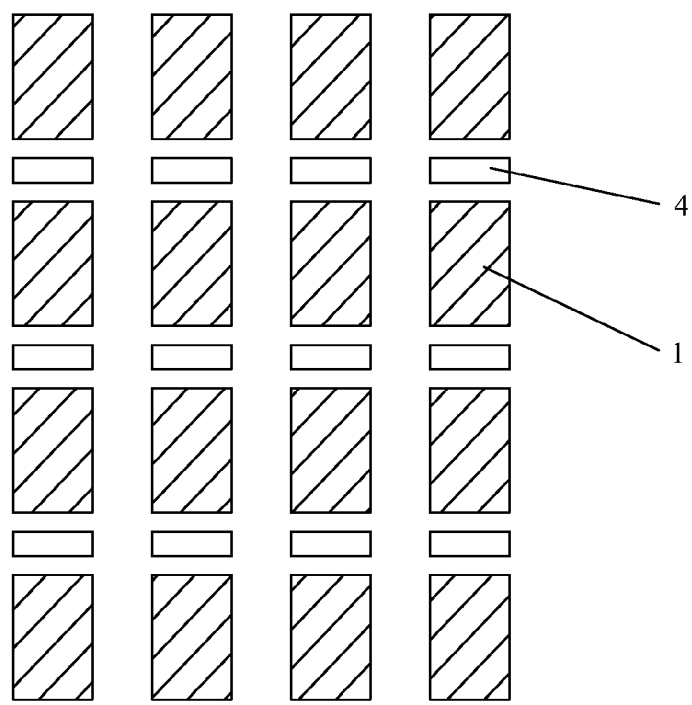
FIG. 7 is a plan schematic diagram II of the array substrate according to the embodiment of the present disclosure.
Figure 8:
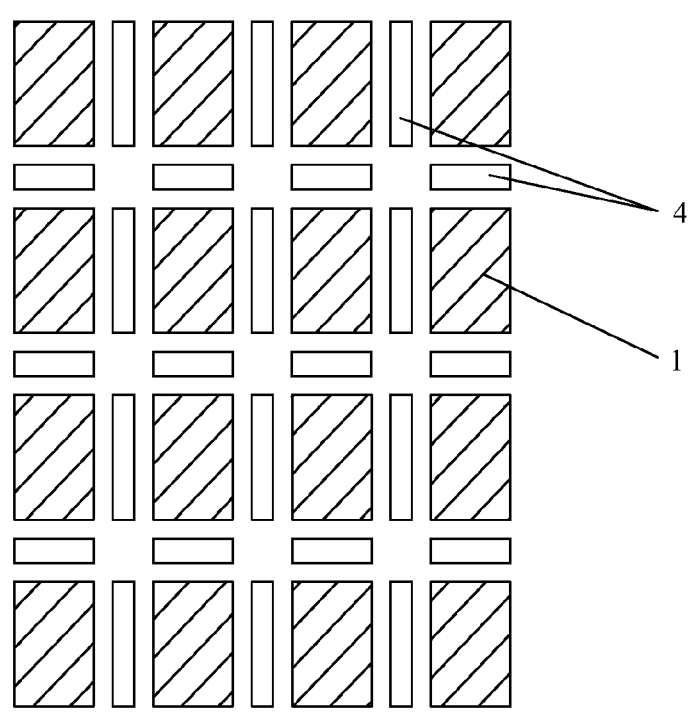
FIG. 8 is a plan schematic diagram III of the array substrate according to the embodiment of the present disclosure.
Figure 9:
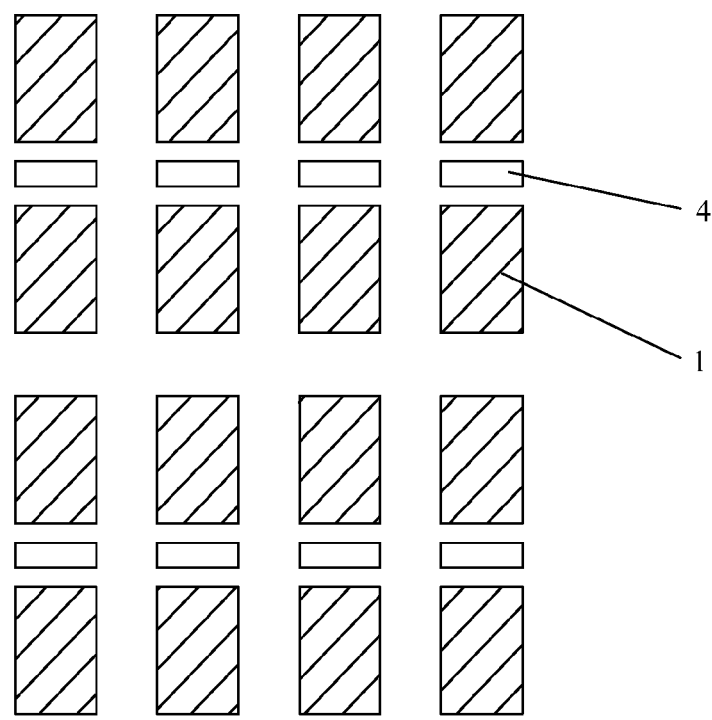
FIG. 9 is a plan schematic diagram IV of the array substrate according to the embodiment of the present disclosure.

As illustrated in FIG. 6, the protrusion 4 is disposed between the long sides of the adjacent first transparent electrodes 1, that is, the protrusions 4 are provided between two adjacent columns of the first transparent electrodes 1, and the protrusions 4 are arranged at intervals along a direction of the long side of the first transparent electrode 1. As illustrated in FIG. 7, the protrusion 4 is disposed between the short sides of the adjacent first transparent electrodes 1, that is, the protrusions 4 are provided between two adjacent rows of the first transparent electrodes 1, and the protrusions 4 are arranged at intervals along a direction of the short side of the first transparent electrode 1. As illustrated in FIG. 8, the protrusion 4 is disposed between the long sides of the adjacent first transparent electrodes 1, and is also disposed between the short sides of the adjacent first transparent electrodes 1, that is, the protrusions 4 are provided between two adjacent rows of the pixel units and two adjacent columns of the pixel units, and the protrusions 4 are arranged at intervals along the direction of the long side and the direction of the short side of the first transparent electrode 1. As illustrated in FIG. 9, with the two adjacent columns of the first transparent electrodes 1 as a group, the protrusions 4 are disposed between the short sides of the two adjacent groups of the first transparent electrodes 1, that is, the protrusions 4 are correspondingly disposed between two groups of pixel units, and the protrusions 4 are arranged at intervals along the direction of the short side of the first transparent electrode 1.

Figure 10:
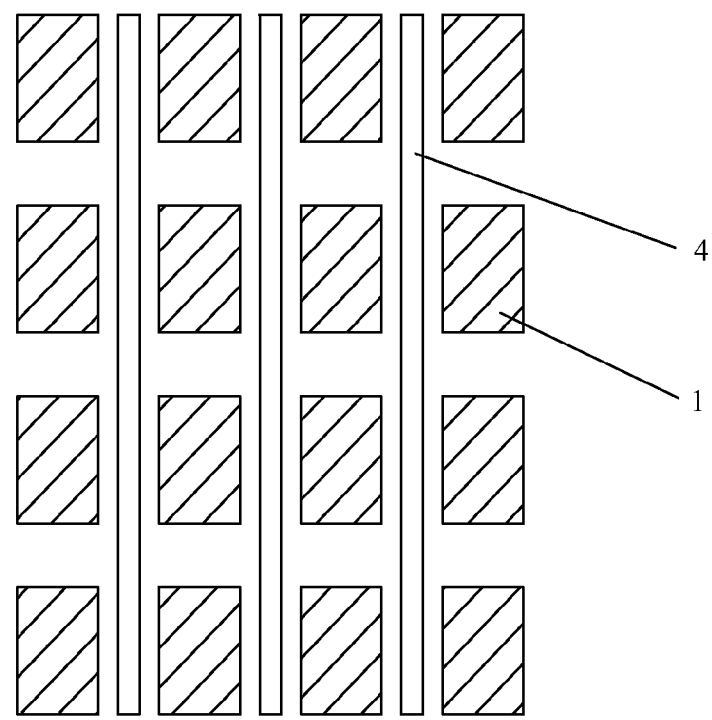
FIG. 10 is a plan schematic diagram V of the array substrate according to the embodiment of the present disclosure.
Figure 11:
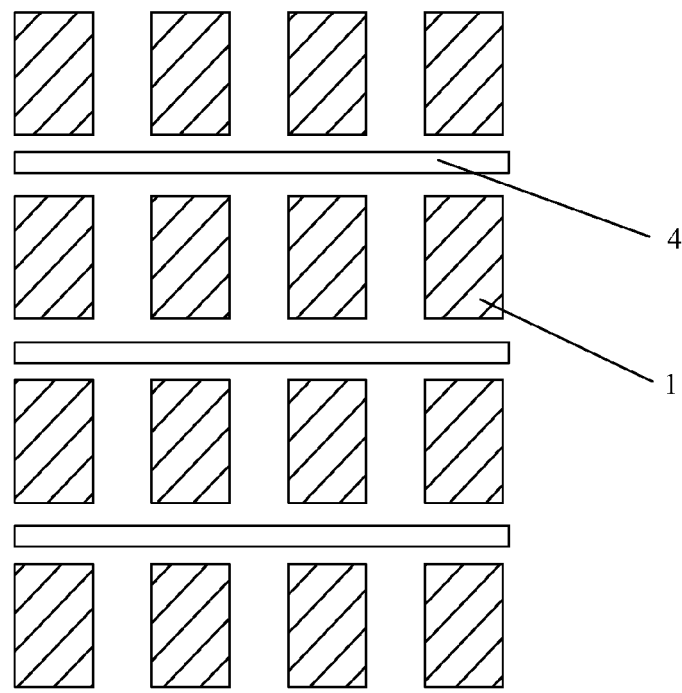
FIG. 11 is a plan schematic diagram VI of the array substrate according to the embodiment of the present disclosure.
Figure 12:
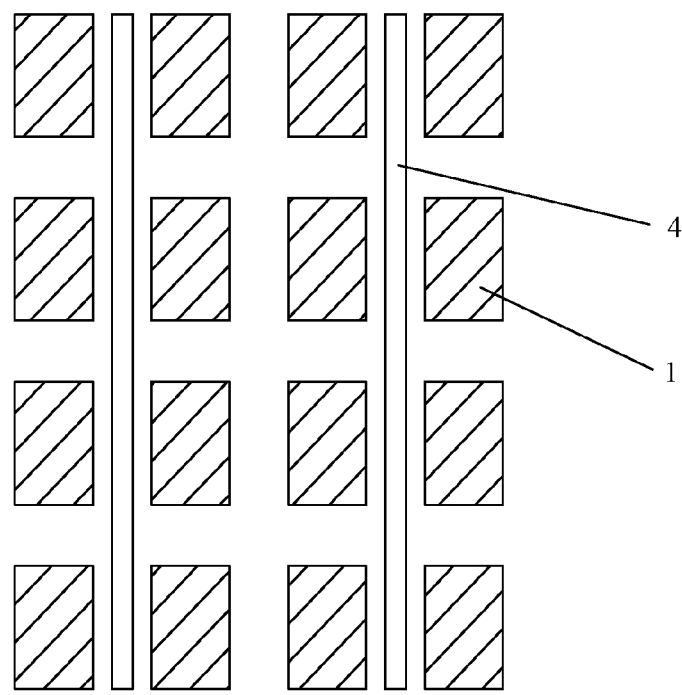
FIG. 12 is a plan schematic diagram VII of the array substrate according to the embodiment of the present disclosure.
Figure 13:
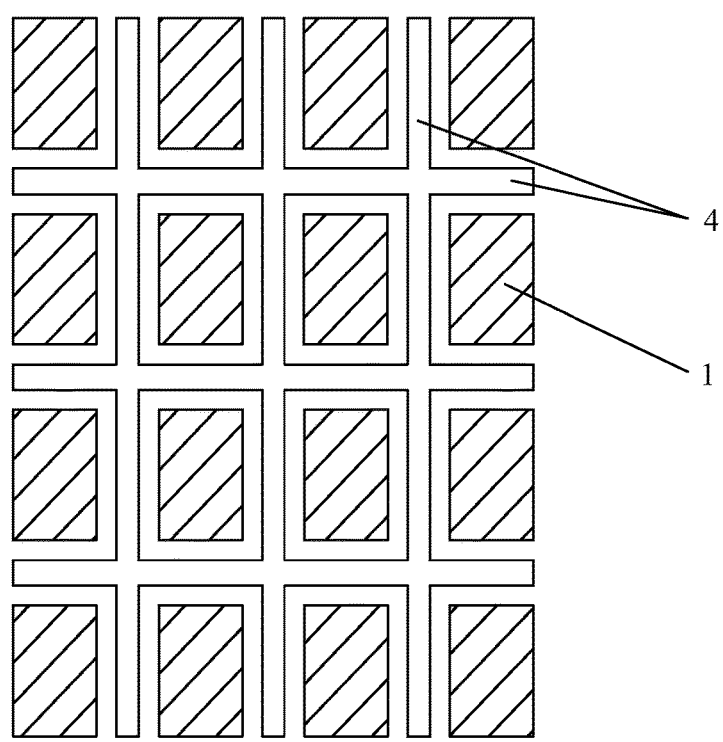
FIG. 13 is a plan schematic diagram VIII of the array substrate according to the embodiment of the present disclosure.

As illustrated in FIG. 10, the protrusion 4 is disposed between the long sides of the adjacent first transparent electrodes 1, that is, the protrusions 4 are provided between two adjacent columns of the first transparent electrodes 1, and the protrusions 4 are arranged continuously along the direction of the long side of the first transparent electrode 1. As illustrated in FIG. 11, the protrusion 4 is disposed between the short sides of the adjacent first transparent electrodes 1, that is, the protrusions 4 are provided between two adjacent rows of the first transparent electrodes 1, and the protrusions 4 are arranged continuously along the direction of the short side of the first transparent electrode 1. As illustrated in FIG. 12, with the two adjacent columns of the first transparent electrodes 1 as a group, the protrusions 4 are disposed between the long sides of the two adjacent groups of the first transparent electrodes 1, that is, the protrusions 4 are correspondingly disposed between two groups of pixel units, and the protrusions 4 are arranged continuously along the direction of the short side of the first transparent electrode 1. As illustrated in FIG. 13, the protrusion 4 is disposed between the long sides of the adjacent first transparent electrodes 1, and is also disposed between the short sides of the adjacent first transparent electrodes 1, that is, the protrusions 4 are provided between two adjacent rows of the pixel units and two adjacent columns of the pixel units, and the protrusions 4 are arranged continuously along the direction of the long side and the direction of the short side of the first transparent electrode 1.

With further reference to FIG. 3 and FIG. 5, in order to achieve a better isolation effect, the protrusion 4 is 1 μm-2 μm higher than the upper surface of the first transparent electrode 1, a width of the protrusion 4 is greater than a width of the gate line, a difference between the width of the protrusion 4 and the width of the gate line is 3 μm-6 μm, the width of the protrusion 4 is greater than a width of the data line 6, and a difference between the width of the protrusion 4 and the width of the data line 6 is 3 μm-6 μm.

With further reference to FIG. 3, in order to further reduce light leakage between the adjacent pixel units, in one embodiment of the present disclosure, the array substrate further comprises a black matrix 7, the black matrix 7 being located between the adjacent pixel units, and corresponding to the protrusion 4. The black matrix 7 may be disposed below a portion of the overlapping region of the adjacent color filter units, or may be disposed above the portion of the overlapping region of the adjacent color filter units, or may also be disposed above the first insulating layer. Due to existence of the black matrix, a height of the protrusion between the adjacent pixel units relative to the upper surface of the first transparent electrode is further increased, which thus can further alleviate the phenomena of electric field interference and light mixing between the adjacent pixel units, improve an aperture ratio and further improve the display effect. In addition, the black matrix 7 corresponds to the respective gate lines and the respective data lines 6.

In the above-described array substrate, the color filter unit is disposed on the array substrate, and thus, the above-described array substrate is also referred to as a Color Filter On Array (COA) array substrate. The array substrate can be specifically used in a display device of a Twisted Nematic (TN) mode, can also be used in a display device of an Advanced Super Dimension Switch (ADS) mode, and can also be used in a display device of an In Plane Switching mode.

The embodiment of the present disclosure further provides a display device comprising the above-described array substrate, and the display device may be a liquid crystal panel, E-paper, a mobile phone, a tablet personal computer, a television, a monitor, a laptop, a digital photo frame, a navigator, and any other product or component having a display function. In the array substrate used by the display device, the protrusion is disposed between adjacent first transparent electrodes, and the protrusion can alleviate the phenomenon of the electric field interference between the adjacent first transparent electrodes, so as to reduce the effect of the phenomenon of the electric field interference on the liquid crystal molecules located between the adjacent first transparent electrodes, which alleviates the phenomena such as color mixing and light leakage between the adjacent pixel units, and further improves the display effect of the display device.

Embodiment Two

With reference to FIG. 3, the embodiment of the present disclosure provides a manufacturing method of an array substrate, the manufacturing method comprising:

101: forming a color filter layer, the color filter layer including a plurality of color filter units 3 arranged in an array, adjacent color filter units 3 having different colors, and edges of the adjacent color filter units 3 being disposed overlapping each other, to form an overlapping region;

102: forming a first insulating layer 2 and a protrusion 4 on the color filter layer, the protrusion 4 at least including a portion in the first insulating layer 2 corresponding to the overlapping region;

103: forming a plurality of first transparent electrodes 1 arranged in an array on the first insulating layer 2, each of the first transparent electrodes 1 corresponding to one color filter unit 3; the protrusion 4 being located between adjacent first transparent electrodes 1, and a vertex of the protrusion 4 being higher than an upper surface of the first transparent electrode 1.

In a preparation procedure of the above-described array substrate, in forming the first insulating layer 2 and the protrusion 4 on the color filter layer, the manufacturing method of the protrusion specifically includes: forming an insulating film on the color filter layer, and forming the first insulating layer 2 and the protrusion 4 of the first insulating layer 2 corresponding to the overlapping region by a patterning process with a half-tone mask. For example, firstly, the insulating film layer is formed on the color filter layer in a mode of coating or overlaying, the insulating film layer may be made of a transparent resin material; and then the transparent resin material outside the overlapping region is removed by film formation, exposure, development and other processes, to reserve the transparent resin material corresponding to the overlapping region, so as to form the desired first insulating layer 2 and the protrusion 4.

In forming the first insulating layer 2 and the protrusion 4 on the color filter layer, the manufacturing method of the protrusion 4 may further include: arranging the edges of the adjacent color filter units 3 overlapping each other, to form a first protrusion portion 41; and naturally forming a second protrusion portion 42 on the first protrusion portion 41, when the first insulating layer 2 is formed. For example, when the edges of the adjacent color filter units 3 are disposed overlapping each other, the first protrusion portion 41 as illustrated in FIG. 3 which is higher than a main body of the color filter unit 3 is formed in the overlapping region of the adjacent color filter units 3; because the first protrusion portion 41 is formed in the overlapping region of the adjacent color filter units 3, when the first insulating layer 2 is formed on the color filter layer by coating or overlaying, the second protrusion portion 42 will be naturally formed on the first insulating layer 2, and the second protrusion portion 42, as illustrated in FIG. 3, covers the first protrusion portion 41.

Of course, when the first protrusion portion 41 which is higher than the main body of the color filter unit 3 is not formed in the overlapping region of the adjacent color filter units 3, the above-described protrusion 4 may also be prepared by a method as follows: forming the desired protrusion 4 by one patterning process, after the first insulating layer 2 is formed on the color filter unit 3; and in this case, the protrusion 4 includes the portion in the first insulating layer 2 corresponding to the above-described overlapping region.

With reference to FIG. 5, further, the above-described manufacturing method of the array substrate further comprises:

104: forming a second insulating layer 8 on the plurality of first transparent electrodes 1;

105: forming a plurality of second transparent electrodes 9 on the second insulating layer 8, wherein, the protrusion 4 further includes a portion in the second insulating layer 8 corresponding to the overlapping region, and the vertex of the protrusion 4 is higher than an upper surface of the second transparent electrode 9.

When the second insulating layer 8 is formed on the first transparent electrode 1 by coating or overlaying, because the second protrusion portion 42 is formed on the first insulating layer 2, a third protrusion portion 43 will be formed naturally on the second insulating layer 8.

The foregoing embodiments merely are exemplary embodiments of the disclosure, and not intended to define the scope of the disclosure, and the scope of the disclosure is determined by the appended claims.

The present application claims priority of Chinese Patent Application No. 201410355555.8 filed on Jul. 24, 2014, the disclosure of which is incorporated herein by reference in its entirety as part of the present application.

The invention claimed is:

1. An array substrate, comprising: a plurality of pixel units arranged in an array, each of the pixel units including a color filter unit and a first transparent electrode stacked on a base substrate, wherein,
a first insulating layer is disposed between the first transparent electrode and the color filter unit, a protrusion is provided between adjacent first transparent electrodes, and a vertex of the protrusion is higher than an upper surface of the first transparent electrodes,
the array substrate further comprises a black matrix, the black matrix being located between adjacent pixel units and corresponding to the protrusion,
the array substrate further comprises a plurality of gate lines and a plurality of data lines disposed on the base substrate,
the protrusion includes a first protrusion portion and a second protrusion portion located above the first protrusion portion, the first protrusion portion is constituted by an overlapping region of adjacent color filter units, and the second protrusion portion is a portion of the first insulating layer corresponding to the overlapping region,
the black matrix is provided between the first protrusion portion and at least one of the data lines,
edges of adjacent color filter units are disposed overlapping each other, to form the overlapping region,
each of the pixel units further includes: a second transparent electrode located above the first transparent electrode, and a second insulating layer disposed between the second transparent electrode and the first transparent electrode, and
the protrusion further includes a portion of the second insulating layer corresponding to the overlapping region, wherein the vertex of the protrusion is higher than an upper surface of the second transparent electrode.

2. The array substrate according to claim 1, wherein the protrusion corresponds to at least one of the gate lines, and/or, the protrusion corresponds to at least one of the data lines, and the gate lines and the data lines are disposed between the color filter unit and the base substrate.

3. The array substrate according to claim 2, wherein, the protrusion is higher than the upper surface of the first transparent electrode by 1 μm-2 μm, a width of the protrusion is greater than a width of each of the gate lines, a difference between the width of the protrusion and the width of each of the gate lines is 3 μm-6 μm, the width of the protrusion is greater than a width of each of the data lines, and a difference between the width of the protrusion and the width of each of the data lines is 3 μm-6 μm.

4. The array substrate according to claim 1, wherein, the first transparent electrode is a pixel electrode, and the second transparent electrode is a common electrode; or, the first transparent electrode is a common electrode, and the second transparent electrode is a pixel electrode.

5. The array substrate according to claim 1, wherein, the protrusion includes a third protrusion located above the second protrusion portion, wherein the third protrusion is the portion of the second insulating layer corresponding to the overlapping region.

6. A display device, comprising the array substrate according to claim 1.

7. A manufacturing method of an array substrate, comprising: forming a color filter layer, the color filter layer including a plurality of color filter units arranged in an array, adjacent color filter units having different colors, and edges of the adjacent color filter units being disposed overlapping each other to form an overlapping region; forming a first insulating layer and a protrusion on the color filter layer, the protrusion at least including a portion of the first insulating layer corresponding to the overlapping region; forming a plurality of first transparent electrodes arranged in an array on the first insulating layer, each of the first transparent electrodes corresponding to one of the color filter units, the protrusion being located between adjacent first transparent electrodes, and a vertex of the protrusion being higher than an upper surface of the first transparent electrodes, wherein, the forming of the first insulating layer and the protrusion on the color filter layer includes: arranging the edges of the adjacent color filter units to overlap each other to form a first protrusion portion; and forming a second protrusion portion on the first protrusion portion upon the first insulating layer being formed; forming a plurality of gate lines and a plurality of data lines; forming a black matrix, the black matrix being located between adjacent pixel units and provided between the first protrusion portion and at least one of the data lines, and corresponding to the protrusion; forming a second insulating layer on the plurality of first transparent electrodes, and forming a plurality of second transparent electrodes on the second insulating layer, wherein, the protrusion further includes a portion in the second insulating layer corresponding to the overlapping region, and wherein the vertex of the protrusion is higher than an upper surface of the second transparent electrodes.

8. The manufacturing method of the array substrate according to claim 7, wherein, the forming the first insulating layer and the protrusion on the color filter layer includes:
    forming an insulating film layer on the color filter layer; and
    forming the first insulating layer and the protrusion at least including the portion of the first insulating layer corresponding to the overlapping region by a patterning process.

* * * * *